(12) United States Patent
Karaiskaj (10) Patent No.: US 8,816,784 B1
(45) Date of Patent: Aug. 26, 2014

(54) SILICON-BASED ATOMIC CLOCKS

(71) Applicant: Denis Karaiskaj, Wesley Chapel, FL (US)

(72) Inventor: Denis Karaiskaj, Wesley Chapel, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 14/043,328

(22) Filed: Oct. 1, 2013

Related U.S. Application Data (63) Continuation of application No. 13/929,146, filed on Jun. 27, 2013.

(60) Provisional application No. 61/664,981, filed on Jun. 27, 2012.

(51) Int. Cl.
  *G04F 5/14* (2006.01)
  *H03L 7/26* (2006.01)

(52) U.S. Cl.
  CPC .................................. *G04F 5/14* (2013.01)
  USPC ............................................ 331/94.1; 331/3

(58) Field of Classification Search
  CPC .............. G04F 5/14; G04F 5/145; H03L 7/26
  USPC ................................................... 331/94.1, 3
  See application file for complete search history.

(56) References Cited

U.S. PATENT DOCUMENTS

| | | | |
|---|---|---|---|
| 6,653,658 B2 | 11/2003 | Burden | |
| 6,867,459 B2 | 3/2005 | Burden | |
| 7,030,704 B2 | 4/2006 | White | |
| 7,619,485 B2 | 11/2009 | DeNatale et al. | |
| 7,852,163 B2 | 12/2010 | Braun et al. | |
| 8,299,858 B2 * | 10/2012 | Gan | 331/3 |
| 2010/0321117 A1 * | 12/2010 | Gan | 331/3 |

OTHER PUBLICATIONS

George et al., "Electron Spin Coherence and Electron Nuclear Double Resonance of Bi Donors in Natural Si", Physical review letters 105.6 (2010): 067601, pp. 1-4.*

Tyryshkin et al., "Coherence of spin qubits in silicon", Journal of Physics: Condensed Matter 18.21 (2006): S783-S93.*

Steger, et al., Quantum Information Storage for over 180s Using Donor Spins in a 28Si Semiconductor Vacuum; Jun. 8, 2012, vol. 33, Science AAAS.

Michael Thewalt, Abstract Submitted for the Mar. 13 Meeting of the American Physical Society., Nov. 12, 2012.

Wolfowicz, Gary, et al., "Atomic Clock Transitions in Silicon-Based Spin Qubits,", Nature Nanotechnology, vol. 8, Aug. 2013, pp. 561-564.

Yang A., Steger M., Karaiskaj D., Thewalt M. L. W., Cardona M., Riemann H., Abrosimov N. V., Churbanov M. F., Gusev A. V., Bulanov A. D., Kaliteevski A. K., Godisov O. N., Becker P., Pohl H.-J., Ager J. W., and Haller E. E., "Optical Detection and Ionization of Donors in Specific Electronic and Nuclear Spin States"Phys. Rev. Lett. 97, 227401 (2006).

(Continued)

*Primary Examiner* — Ryan Johnson
(74) *Attorney, Agent, or Firm* — Thomas | Horstemeyer, LLP (57) ABSTRACT

In one embodiment, a silicon-based atomic clock for use in an electronic device includes a single-isotope silicon crystal and energy level transitions within the silicon are used as a frequency resonance of the clock.

23 Claims, 6 Drawing Sheets

(56) References Cited

OTHER PUBLICATIONS

M. Steger, T. Sekiguchi, A. Yang, K. Saeedi, M. E. Hayden, M. L. W. Thewalt, K. M. Itoh, H. Riemann, N. V. Abrosimov, P. Becker, and H.-J. Pohl, "Optically-detected NMR of optically-hyperpolarized 31P neutral donors in 28Si" J. Appl. Phys. 109, 102411 (2011).

Steger M., Yang A., Thewalt M. L. W., Cardona M., Riemann H., Abrosimov N. V., Churbanov M. F., Gusev A. V., Bulanov A. D., Kovalev I. D., Kaliteevskii A. K., Godisov O. N., Becker P., Pohl H.-J., Haller E. E., and Anger J. W., "High-resolution absorption spectroscopy of the deep impurities S and Se in 28Si revealing the 77Se hyperfine splitting" Phys. Rev. B 80, 115204 (2009).

Sekiguchi T., Steger M., Saeedi K., Thewalt M. L. W., Riemann H., Abrosimov N. V., and Nötzel N., "Hyperfine Structure and Nuclear Hyperpolarization Observed in the Bound Exciton Luminescence of Bi Donors in Natural Si" Phys. Rev. Lett. 104, 137402 (2010).

Abe Eisuke, Tyryshkin Alexei M., Tojo Shinichi, Morton John J. L., Witzel Wayne M., Fujimoto Akira, Ager Joel W., Haller Eugene E., Isoya Junichi, Lyon Stephen A., Thewalt Mike L. W., and Itoh Kohei M., "Electron spin coherence of phosphorus donors in silicon: Effect of environmental nuclei" Phys. Rev. B 82, 121201(R) (2010).

A. R. Stegner, H. Tezuka, H. Riemann, N. V. Abrosimov, P. Becker, H.-J. Pohl, M. L. W. Thewalt, K. M. Itoh, and M. S. Brandt, "Correlation of residual impurity concentration and acceptor electron paramagnetic resonance linewidth in isotopically engineered Si" Appl. Phys. Lett. 99, 032101 (2011).

G. Feher, "Electron Spin Resonance Experiments on Donors in Silicon. I. Electronic Structure of Donors by the Electron Nuclear Double Resonance Technique" Phys. Rev. 114, 1219 (1959).

George Richard E., Witzel Wayne, Riemann H., Abrosimov N. V., and Nötzel N., Thewalt Mike L. W., and Morton John J. L., "Electron Spin Coherence and Electron Nuclear Double Resonance of Bi Donors in Natural Si", Phys. Rev. Lett. 105, 067601 (2010).

John J. L. Morton, Alexei M. Tyryshkin, Richard M. Brown, Shyam Shankar, Brendon W. Lovett, Arzhang Ardavan, Thomas Schenkel, Eugene E. Haller, Joel W. Ager, and S. A. Lyon, "Solid-state quantum memory using the 31P nuclear spin" Nature 455, 1085-1088 (2008).

G. W. Morley, M. Warner, A. N. Stoneham, P.T. Greenland, J.v. Tol. C.W. M. Kay, and G. Aeppli, "The initialization and manipulation of quantum information stored in silicon by bismuth dopants", Nat. Mat. 9, 725 (2010).

Hiroki Morishita, Eisuke Abe, Waseem Akhtar, Leonid S. Vlasenko, Akira Fujimoto, Kentarou Sawano, Yasuhiro Shiraki, Lukas Dreher, Helge Riemann, Nikolai V. Abrosimov, Peter Becker, Hans-J. Pohl, Mike L. W. Thewalt, Martin S. Brandt, and Kohei M. Itoh, "Linewidth of Low-Field Electrically Detected Magnetic Resonance of Phosphorus in Isotopically Controlled Silicon" Applied Physics Express 4, 021302 (2011).

Morishita H., Vlasenko L. S., Tanaka H., Semba K., Sawano K., Shiraki Y., Eto M., and Itoh K. M., "Electrical detection and magnetic-field control of spin states in phosphorus-doped silicon" Phys. Rev. B 80, 205206 (2009).

W. Akhtar, H. Morishita, L.S. Vlasenko, D.S. Poloskin, and K. M. Itoh, "Electrically detected magnetic resonance of phosphorousduetospin dependent recombination with triplet centers in g-irradiated silicon" Physica B 404, 4583 (2009).

Yang A., Steger M., Sekiguchi T., Karaiskaj D., Thewalt M. L. W., Cardona M., Itoh K. M., Riemann H., Abrosimov N. V., Churbanov M. F., Gusev A. V., Bulanov A. D., Kovalev I. D., Kaliteevskii A. K., Godisov O. N., Becker P., Pohl H.-J., Ager J. W., and Haller, E. E., "Single-frequency laser spectroscopy of the boron bound exciton in 28Si" Phys. Rev. B 80, 195203 (2009).

* cited by examiner

SILICON-BASED ATOMIC CLOCKS

CROSS-REFERENCE TO RELATED APPLICATION(S)

This application claims priority to U.S. Provisional Application Ser. No. 61/664,981, filed Jun. 27, 2012, and is a continuation of copending U.S. utility application entitled, "Silicon-Based Atomic Clocks," having Ser. No. 13/929,146, filed Jun. 27, 2013, both which are hereby incorporated by reference herein in its entirety.

BACKGROUND

The performance of many electronic devices is often limited by the performance of the clocks they use. For example, the receiver in a global positioning system (GPS) works by attempting to align an internally-generated pseudorandom signal to an identical signal sent by a satellite and measuring the phase difference between the two signals. The receiver calculates the time required by the satellite signal to reach the receiver and thereby gives the distance between the satellite and the receiver. In this system, accurate timing is needed not only for precise determination of distance, but also for fast acquisition of the satellite signal. Other examples in which timing determines the ultimate performance of the system range from parallel analog-to-digital converters to spread-spectrum communications. Furthermore, frequency references provide the basis for a large number of other applications, such as digital communication, synchronization of networks, and power distribution.

In applications such as those identified above, an atomic clock would greatly enhance the performance of the system. Like quartz oscillators and clocks, atomic clocks function by generating a very stable frequency from a reference. The main difference is that a quartz oscillator derives its frequency from a mechanically vibrating reference, which makes the frequency sensitive to long-term changes in mechanical dimensions and stress. An atomic clock on the other hand derives its frequency from the energy difference between atomic states, which is a constant of nature and is therefore predictable and stable. Unfortunately, the size, power consumption, and difficulty to integrate atomic clocks with existing electronic devices have been the prohibitive factors for the use of atomic clocks in these devices.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

As can be appreciated from the above discussion, it would be desirable to have an atomic clock that can be practically integrated with existing electronic devices. Described in the disclosure that follows are silicon-based atomic clocks that are well suited for such integration. As described below, silicon-based atomic clocks are desirable not only because of their robustness as compared to gas-based atomic clocks, but also because they can be miniaturized to the point at which they can be incorporated into chip-sized devices.

In the following disclosure, various specific embodiments are described. It is to be understood that those embodiments are example implementations of the disclosed inventions and that alternative embodiments are possible. All such embodiments are intended to fall within the scope of this disclosure.

The accuracy of an atomic clock is determined in part by the frequency width of the resonance that it generates when being probed. Generally speaking, the narrower the frequency width, the greater the accuracy of the clock. Resonances due to donors and acceptors in naturally-occurring isotopic silicon are very narrow due in part to the crystalline perfection and chemical purity achieved in the crystal growth of silicon. However, the frequency width of most impurity transitions is wider because of the isotopic randomness of the material.

The advent of isotopically-engineered silicon has made energy level transitions due to impurity dopants possible for atomic clock applications. The resonance frequency width can be substantially narrowed by producing single-isotope silicon crystals. For example, the full width at half maximum (FWHM) of phosphorus bound exciton transitions in single-isotope silicon was measured to be approximately 2.4 MHz, which is in the order of atomic transitions. Furthermore, hyperfine splitting of 0.12 GHz was observed at very modest magnetic fields, making isotopically-engineered silicon a candidate for solid-state atomic clocks. In view of this, it is proposed that energy level transitions in silicon be used as frequency standards for atomic clocks. Example materials, systems, and methods for generating clock signals based upon such transitions are described below.

Figure 1A:
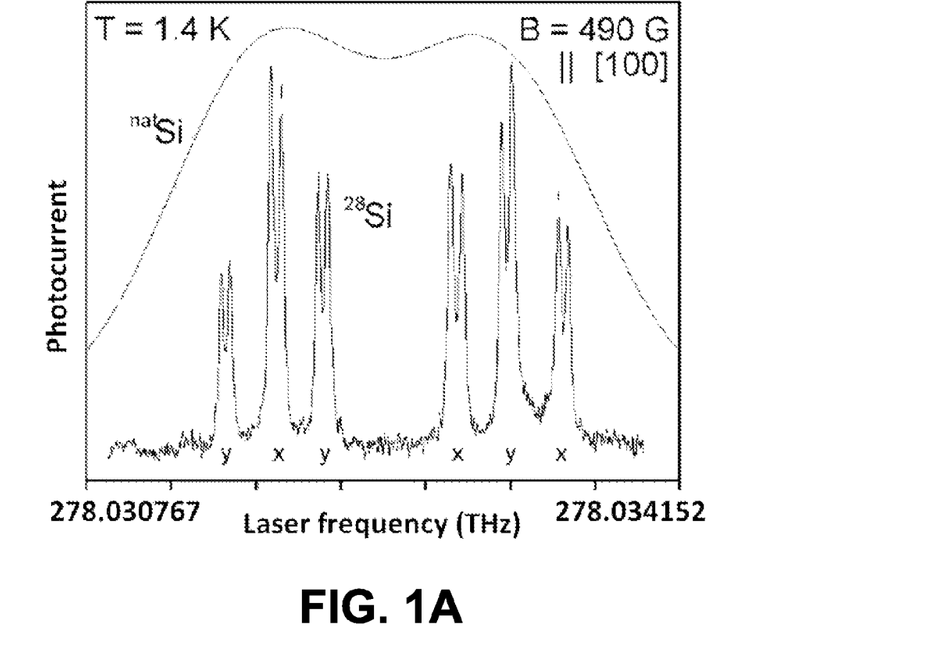
FIG. 1A is a graph that shows the Zeeman spectrum of phosphorus bound
Figure 1B:
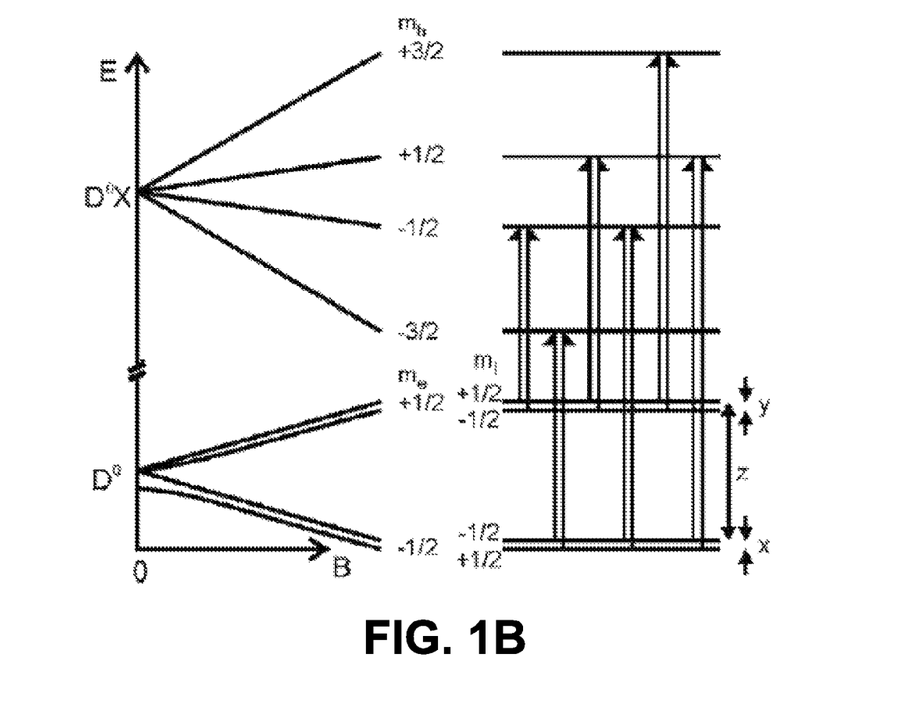
FIG. 1B is a level scheme describing the origin of the transitions of FIG. 1A.

FIG. 1A shows the Zeeman spectrum of the phosphorus bound exciton, no-phonon transitions in a silicon sample enriched to 99.991% $^{28}Si$. The photoluminescence excitation spectra at T=1.4 K with a magnetic field of 490 G parallel to the [100] axis are shown in the figure. The same spectra obtained in silicon of natural isotopic composition ($^{nat}Si$) are also shown in the figure for purposes of comparison. FIG. 1B is a level scheme describing the origin of the transitions (six doublets) shown in FIG. 1A. $D^0$, the neutral donor, is the ground state of the phosphorus bound exciton. $D^0$ has a zero-field hyperfine splitting of 0.12 GHz and, under an applied magnetic field, splits into four hyperfine levels (shown on the right) determined by the projections of the electron spin $m_e=\pm 1/2$ and the nuclear spin $m_I=\pm 1/2$. The donor bound exciton $D^0X$ has two electrons in a spin singlet and, under a magnetic field, splits only according to the j=3/2 hole projections. The six allowed transitions are ordered in increasing energy from left to right, in correspondence with the transitions on the left side of the figure.

As noted above, the stability of an atomic clock is determined in part by the frequency width of the resonance that it generates when probed. Atomic clocks are often characterized by their Allan deviation $\sigma(\tau)$, which is a measure of the fractional frequency stability as a function of averaging time $\tau$. Over short averaging times, the stability of many atomic clocks is characterized by white frequency noise. The Allen deviation is given by, $$\sigma(\tau) = \frac{\chi}{Q\left(\frac{S}{N}\right)} \frac{1}{\sqrt{\tau}}$$

in terms of signal-to-noise ratio S/N and the resonance quality factor Q. The resonance quality is defined as the ratio of resonance frequency $v_0$ over the linewidth $\Delta v$, $Q = v_0/\Delta v$.

In the disclosed systems and methods, the energy level transitions of impurities often found in silicon (Si) are used as a frequency standard for the atomic clocks. Silicon in the naturally-occurring isotopic composition consists of 92.23% $^{28}$Si+4.67% $^{29}$Si+3.10% $^{30}$Si. Therefore, the importance of inhomogeneous isotope broadening effects in setting many of the broadening limits in natural silicon was at first surprising given that natural silicon is close to monoisotopic. However, the vast majority of impurity transitions in natural silicon were found be dominated by isotopic broadening. In addition to significantly broadening the donor and acceptor transitions in the far and near infrared, the isotopic randomness was the origin of the splitting of the ground state of acceptors in silicon. A theoretical framework was developed that provided clear insights on how the isotopic randomness splits the fourfold degenerate ground state of acceptors in natural silicon into doublets. The removal of this remaining source of broadening revealed that impurity transitions in silicon are "atomic like." Therefore, the isotopically purified/enriched versions $^{28}$Si, $^{29}$Si, and $^{30}$Si, and in particular the abundant $^{28}$Si isotope, could be doped at approximately $10^{12}$ to $10^{14}$ cm$^{-3}$ with donors or acceptors and effectively used for atomic clock applications.

It should be noted that the theoretical modeling used to reproduce the splitting of the acceptor ground state predicts only a small energy shift to the transitions of individual donor impurities (and a splitting of the ground state for acceptors). The broadening observed spectroscopically is a result of statistical averaging over a large ensemble of impurities. Therefore, isolating individual donor impurity atoms in silicon crystals of natural isotopic composition would have a similar effect as removing the isotopic randomness. If laser light is used to excite the crystal and interrogate the resonance, this would mean that the laser frequency should be matched to the impurity transition. In principle, all the transitions of donors and acceptors in natural and isotopically-enriched silicon, including and their hyperfine splitting, could be used to build an atomic clock. Donors and acceptor impurities in silicon, with few exceptions such as the phosphorus $^{31}$P, come in different isotopes. For example the most common acceptor, boron, has two isotopes in the natural occurrence $^{10}$B and $^{11}$B, with a ratio of 80% to 20%. The impurity atoms used could be in their natural occurrence or single isotope such as boron ($^{11}$B). There is a shift in the ionization energy for each of the isotopes, therefore using single-isotope impurities may be desirable.

Figure 2A:
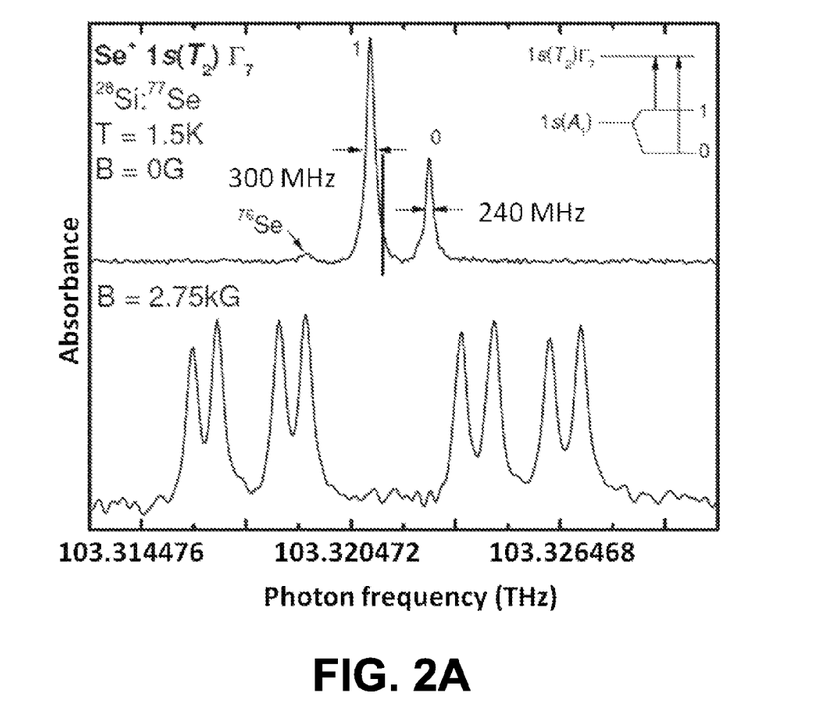
FIG. 2A is a graph that shows the spectra of $^{77}Se^+1s(T_2)\Gamma_7$ transition in $^{28}Si$.
Figure 2B:
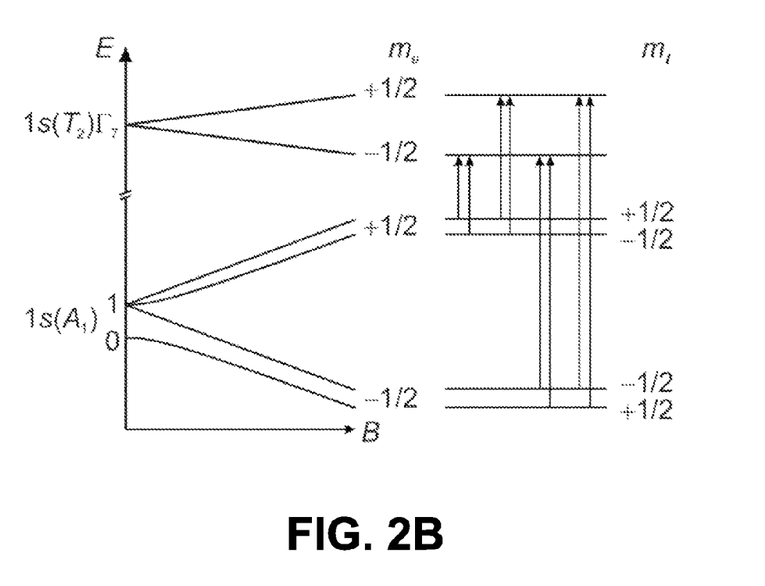
FIG. 2B is a level scheme describing the origin of the transitions of FIG. 2A.

FIG. 2A shows the spectra of the $^{77}$Se$^+$1s(T$_2$)$\Gamma_7$ transition in $^{28}$Si. Illustrated in the top of the figure are the spectra without an external magnetic field showing the ground-state hyperfine splitting. The spectra show extremely narrow lines with a FWHM of 240 MHz. Residuals of the $^{76}$Se can be seen and the vertical line is located halfway between the $^{76}$Se and $^{78}$Se energies. In the bottom of the figure are the spectra under a 2750 G magnetic field. Four doublets are observed. FIG. 2B is a level diagram for the $^{77}$Se$^+$1s(T$_2$)$\Gamma_7$ transitions indicating the origin of the eight components shown in the bottom of FIG. 2A.

Impurity Transitions of Interest

Impurity transitions that can be used for atomic clock applications will now be described. Impurity atoms that contribute free electrons to the host crystal are known as donors, whereas atoms that remove electrons (or create holes) are known as acceptors. The transitions to be used as the frequency standard could originate from (1) a neutral donor or acceptor in natural or isotopically-enriched silicon or (2) excitons (electron-hole pairs) bound to neutral donors or acceptors in natural or isotopically-enriched silicon, called impurity bound excitons. Substitutional group-V atoms include phosphorus (P), arsenic (As), and antimony (Sb), and interstitial monovalent atoms include lithium (Li) and sodium (Na). The group-V atoms have one more valence electron than the silicon atom they replace. Furthermore, this electron is loosely bound to the group-V atom in silicon so that it can be easily excited into the conduction band of the host silicon crystal. Substitutional group-VI atoms such as sulfur (S), selenium (Se), and tellurium (Te) can contribute up to two electrons and are known as double donors. Boron (B), gallium (Ga), indium (In), and aluminum (Al) are shallow acceptors in silicon. All these atoms belong to group III of the periodical table and have one less valence electron than silicon. Therefore when these atoms substitute a silicon atom they create a hole that is loosely bound to the negatively-charged acceptor. Substitutional group-II atoms such as beryllium (Be) and zinc (Zn) in silicon can contribute two positive charges to the host crystal and are called double acceptors. Deeper impurities like gold (Au), silver (Ag), platinum (Pt), and copper (Cu) are more likely to remain neutral at room temperature, and therefore can be ionized or neutralized using optical excitation.

Neutral Donor and Acceptor Transitions

The discrete states of the donor electron are classified according to their principal quantum number n, angular momentum I, and spin. In atomic physics these states are denoted as 1s, 2s, 2p, etc. and similar notations are used to denote the bound states of shallow impurities. These transitions typically need to be interrogated in the far infrared.

Figure 3A:
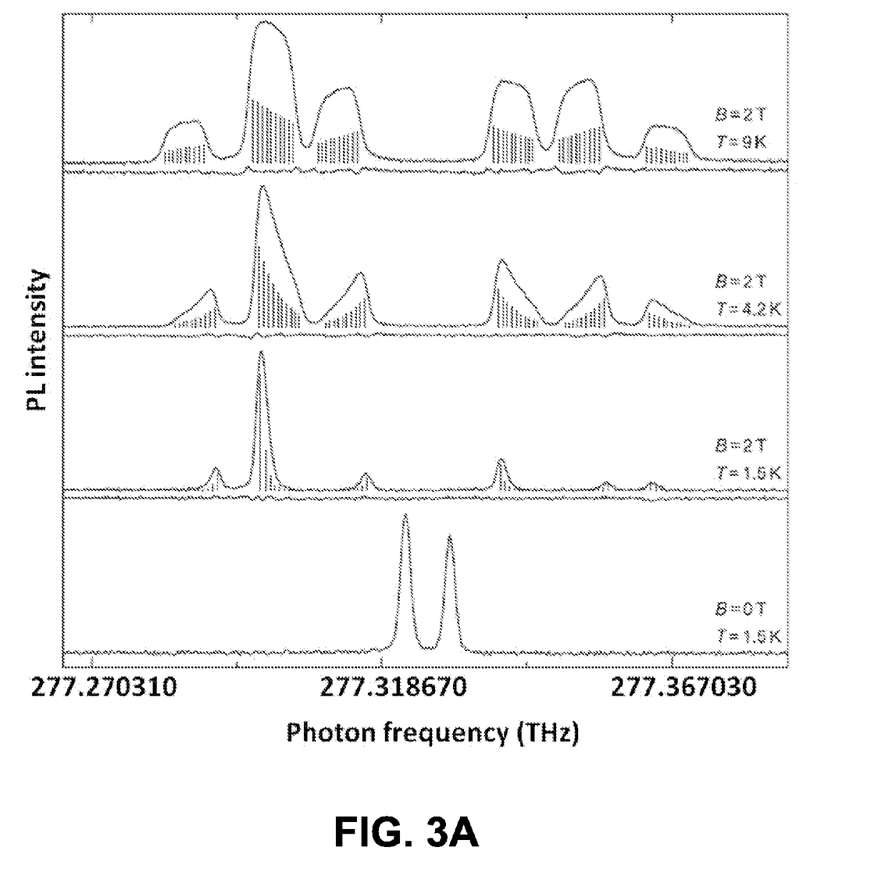
FIG. 3A is a graph of photoluminescence of bismuth no-phonon bound exciton $D^0X$ transitions within single-isotope silicon at zero magnetic field and at 2 Tesla.
Figure 3B:
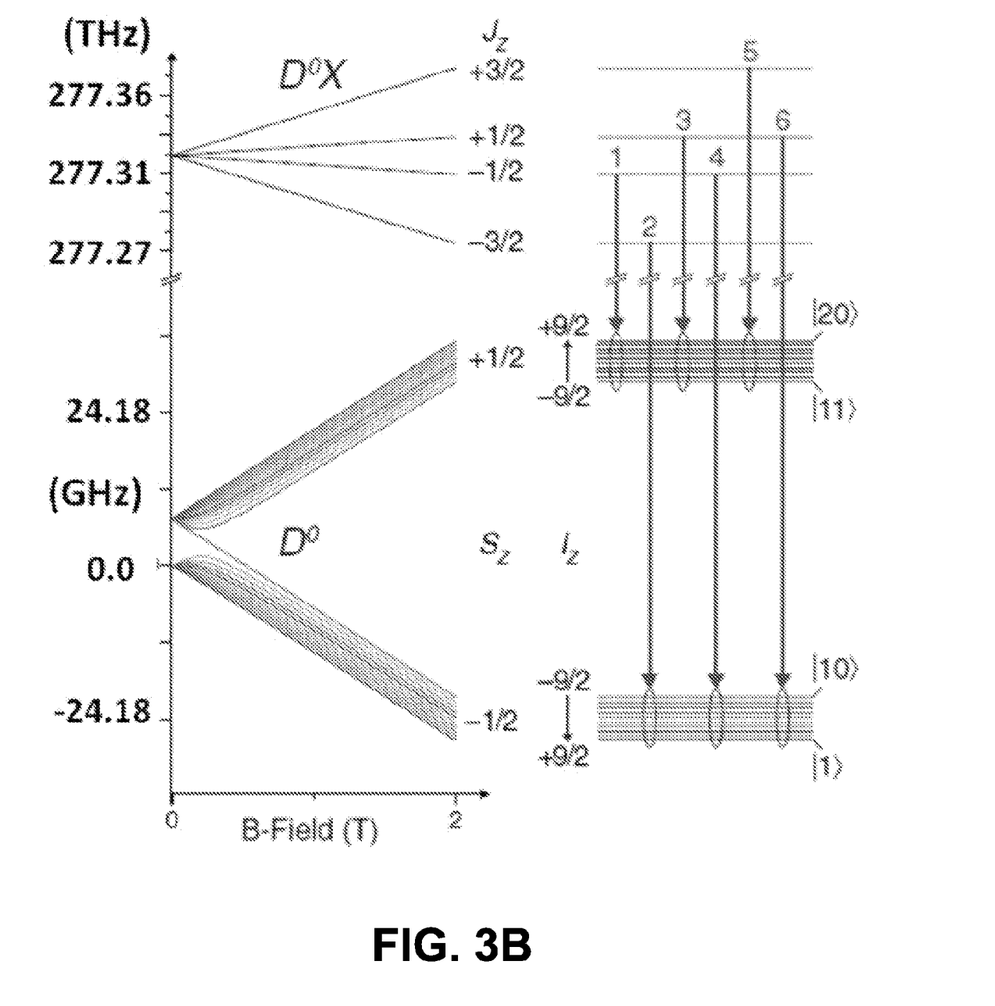
FIG. 3B is a level scheme describing the transitions of FIG. 3A indicating the origin of the photoluminescence structure at the zero and 2 Tesla magnetic fields.

FIG. 3A shows the photoluminescence of the bismuth (Bi) no-phonon bound exciton D$^0$X transitions at zero magnetic field and at 2 Tesla for different temperatures. The vertical lines in the figure indicate the relative strengths of individual hyperfine components. FIG. 3B shows Zeeman level diagrams for the transitions from the bismuth bound exciton D$^0$X to the neutral donor D$^0$ indicating the origin of the photoluminescence structure at zero and 2 Tesla magnetic field. J$_z$ identifies the hole angular momentum projections in D$^0$X, whereas S$_z$ and I$_z$ identify electron and nuclear spin projections in D$^0$, respectively. The allowed transitions at 2T are identified on the right in order of increasing energy, with each having 10 hyperfine components.

No-Phonon Transitions of Impurity Bound Excitons

When the silicon crystal contains a small number of donors and acceptors in their neutral state, the excitons will be attracted to these impurities. Because this attraction lowers the exciton energy, neutral impurities at low temperatures are very efficient at trapping excitons to form the impurity bound excitons. The impurity bound exciton is a multi-particle system. In the case of an exciton bound to donors, it comprises two interacting electrons and one hole, whereas in the case of one electron bound to a neutral acceptor, it comprises two interacting holes and one electron. In silicon, electrons at the conduction band minimum and holes at the valence band maximum can recombine by emission of a characteristic photon. Silicon is an indirect bandgap semiconductor, i.e., the maximum of the valence band and minimum of the conduction band are not at the same position in k-space. Therefore, electrons and holes can recombine and emit a photon with the help of k-vector conserving phonon. When a phonon fulfills the k-vector conservation requirement, the transition is called phonon assisted. However, it is possible for impurity bound excitons to have no-phonon transitions, i.e., transitions that do not invoke a k-vector conserving phonon. The spatial localization of the exciton to the impurity site in real space leads to a greater delocalization/diffusiveness of the electron and hole wave functions in k-space. This leads to an overlap of the electron and hole wave functions thus permitting electron-hole transitions that conserve the k-vector. The intensity of no-phonon transitions will therefore increase with increasing localization energy.

Figure 4A:
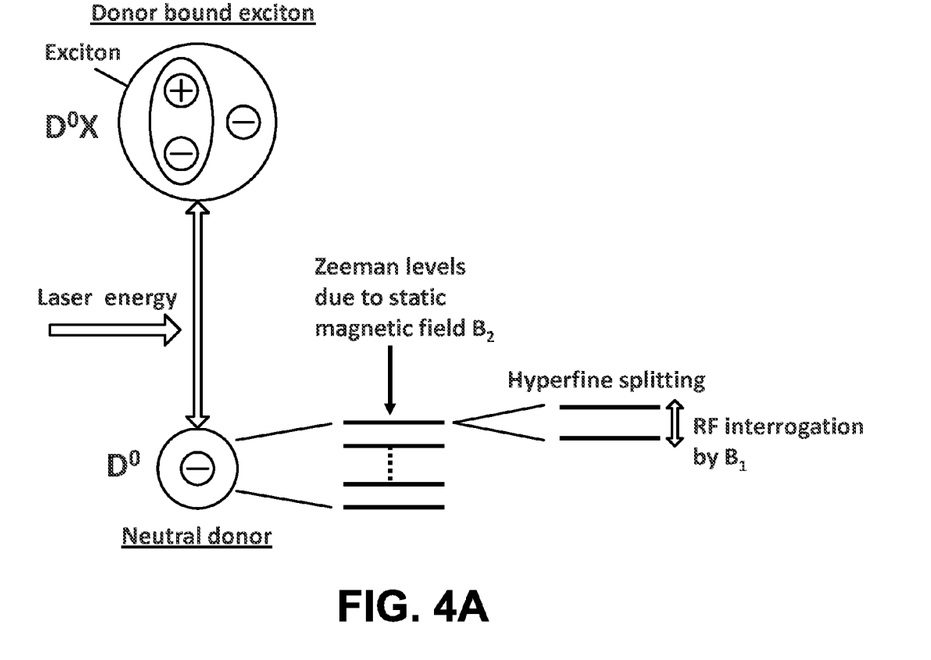
FIG. 4A is a schematic drawing that illustrates a no-phonon bound exciton transition that can be used to build an atomic clock.
Figure 4B:
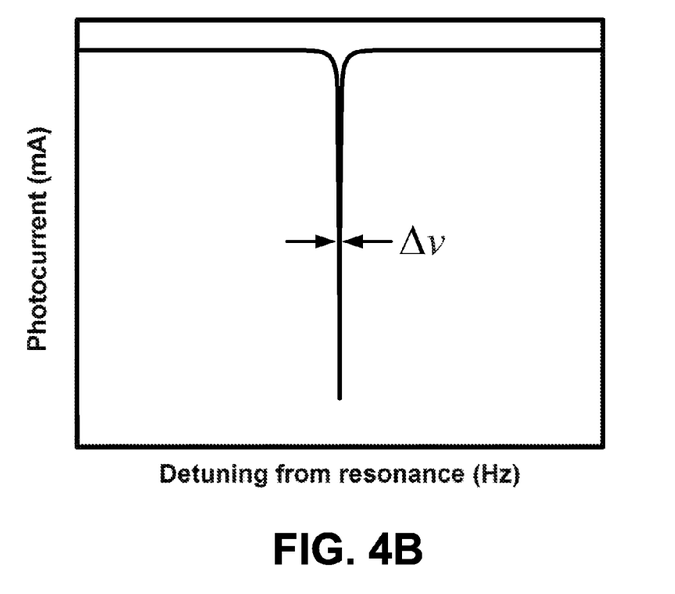
FIG. 4B is a graph of a measured photocurrent as an RF frequency is scanned over the hyperfine splitting shown in FIG. 4A.

FIG. 4A shows schematic of a no-phonon impurity bound exciton transition that can be used to build an atomic clock. The donor bound exciton is the excited state of the system, which can be optically excited by a frequency-stabilized laser, such as a vertical cavity surface-emitting laser (VC-SEL). The Coulomb bound electron-hole pair recombines leaving the neutral donor behind. A small static magnetic field $B_2$ splits the donor ground state into its Zeeman sublevels, which are further split by the hyperfine interaction. A small coil can be used to provide a field (e.g., radio frequency (RF) field) $B_1$ that is used to interrogate the hyperfine resonance. FIG. 4B shows the measured photocurrent as the RF frequency is scanned over the hyperfine splitting frequency. The measure $\Delta v$ corresponds to the frequency width of the resonance.

Greater localization of the electrons and holes in real space implies greater delocalization/diffusiveness in k-space. As a result, deeper impurities with higher ionization energy will have stronger no-phonon transitions than shallower impurities. No-phonon transitions of impurity bound excitons in silicon can be exceedingly narrow. Phonon-assisted transitions will, in general, be broader than no-phonon transitions because of the dispersion in the phonon spectrum. In donor bound exciton transitions, one electron and hole forming the exciton recombine leaving a neutral donor behind, whereas in the acceptor bound exciton one electron and hole recombine leaving a neutral acceptor behind. The neutral donor is split in the magnetic field into the projections of the electron spin $m_e=\pm 1/2$, whereas the neutral acceptor is split according the hole angular momentum $j=3/2$. Therefore, acceptor bound exciton transitions have, in general, a more complicated structure. Because of the narrowing of the bound exciton transitions and the absence of the nuclear spin in isotopically enriched $^{28}$Si, the splitting because of hyperfine interactions with the nuclear spin of the impurity atom can be clearly resolved. Similar to atomic transitions, such as the rubidium (Rb) or cesium (Cs) standards, the hyperfine splitting of impurity bound exciton transitions in silicon can be used for atomic clocks.

Example Impurity Atoms for Atomic Clock Applications

Candidates for transitions will now be discussed. Donor bound exciton transitions are usually narrower than the acceptor counterparts and have a simpler structure. The phosphorus donor impurity can be easily introduced in silicon, which makes this a desirable impurity. The no-phonon homogeneous linewidth of the bound exciton in isotopically-pure silicon was measured to be approximately 2.4 MHz at a magnetic field of 440 G, which is only twice the lifetime limited linewidth set by the $^{31}$P bound exciton lifetime of 272 ns. The zero-field hyperfine splitting is 117.53 MHz whereas at zero field the linewidths amount to 70 neV $^{31}$P has a I=1/2 nuclear spin as compared to the I=3/2 for $^{87}$Rb and I=7/2 for $^{133}$Cs, leading to a simpler hyperfine splitting. The phosphorus bound exciton transitions in isotopically enriched $^{28}$Si and silicon of natural isotopic composition $^{nat}$Si are shown in FIG. 1A. The difference between the spectra reveals the importance of the isotopic broadening. A schematic describing the origin of the six doublets observed in $^{28}$Si is also shown. Each doublet in the spectra is determined by the projections of the electron spin $m_e=\pm 1/2$ and hole angular momentum $j=3/2$, whereas the doublet splitting is a result of the hyperfine interactions.

Another impurity with a significantly larger hyperfine splitting is the selenium double donor. Chalcogens such as selenium give rise to a number of different donor centers in silicon. These centers can involve one, two, or more selenium atoms and can be either neutral or ionized. Because of their deep nature, the 1s state can have transitions that are not observed for shallow donors. The donor atom occupying the tetrahedral lattice site has a sixfold degenerate s state, which can be split by the central cell potential into a singlet ($A_1$), a triplet ($T_2$), and a doublet (E) or ($\Gamma_6$), ($\Gamma_8$), and ($\Gamma_7+\Gamma_8$) including spin. The valley orbit splitting is strongest for the 1s state. The transition from the $1s(A_1)$ to $1s(T_2)$ is effectively mass theory forbidden but symmetry allowed. The fact that this transition is only partially allowed contributes to its long lifetime and therefore to a narrow linewidth of approximately 240 MHz, making it possible to resolve the $^{77}$Se hyperfine splitting using this final state. The hyperfine splitting would be obscured by the isotopic broadening in natural silicon and therefore is only observable in isotopically enriched $^{28}$Si. In addition, selenium has more than one isotope and the dopant itself has been enriched to 97.1% $^{77}$Se. The resolved hyperfine splitting at zero magnetic field of 1.68 GHz and the resolved Zeeman component at a magnetic field of 2750 G are shown in FIG. 2A. The level diagram describing the individual transitions is included in FIG. 2B.

Bismuth (Bi) is the deepest group-V donor in silicon, with a binding energy of ~71 meV. Furthermore, bismuth is monoisotopic ($^{209}$Bi) with a large I=9/2 nuclear spin and also a large hyperfine interaction of 1.475 GHz. At zero magnetic field, the neutral donor $D^0$ ground state is split into a doublet having total spins of 5 and 4, which are separated by 7.377 GHz, five times the hyperfine interaction. At a nonzero magnetic field, the donor bound exciton splits into six components according to the diagram shown in FIG. 3B, each of them having 10 hyperfine subcomponents. The six components under magnetic field are determined by the electron spin and hole angular momentum analogous to the phosphorus donor.

Neutral and Ionized Impurities in Isotopically Pure Silicon

Impurities can be thermally or optically ionized, which involves removing the donor electron from the impurity center and leaving the positively charged (ionized) donor behind. Many impurities are thermally ionized at room temperature. Therefore, to maintain them, neutral cooling may be needed. Impurities that remain neutral at room temperature can be optically ionized by applying above-bandgap light to the crystal. The specifics of the optical ionization/neutralization depend on the doping level of donors and acceptors present in the crystal. However, by turning on and off above-bandgap illumination provided by a laser can lead to ionization or neutralization of impurities. By ionizing the donors and removing hyperfine coupled electrons, the temperature dependence of the coherence time changes profoundly. For the phosphorus impurities in single-isotope silicon ($^{28}$Si), spin coherence times of 4 hours at cryogenic temperatures and 30 minutes at room temperatures have been observed. At room temperature, the coherence time corresponds to a resonance frequency width of 0.00055 Hz and quality factor of $Q=2.13\times10^{11}$. Achieving readout without significant broadening of the resonance by optical consecutive ionization/neutralization could lead to accurate atomic clock devices that are less sensitive to temperature.

Example Atomic Clocks

Figure 5:
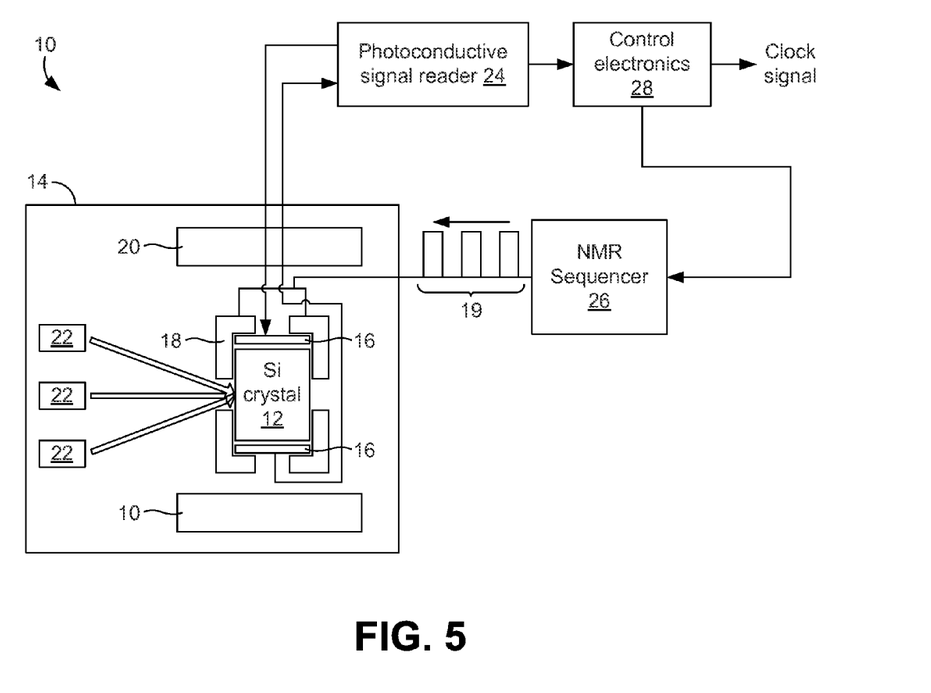
FIG. 5 is a block diagram of an embodiment of a silicon-based atomic clock.

FIG. 5 illustrates an example silicon-based atomic clock 10 that can, for instance, be integrated into a compact (e.g., portable) electronic device. As shown in FIG. 1, the atomic clock 10 comprises a single-isotope silicon crystal 12 that is doped with impurity atoms. The silicon crystal 12 can be supported on a suitable substrate (not shown) in a manner in which it is in an unstressed, strain-free state. Regardless, the silicon crystal 12 can, at least in some embodiments, be contained within a temperature-controlled housing 14. The housing can be cooled by an appropriate cooling apparatus (not shown), such as a thermoelectric cooling apparatus or a liquid gas cooling apparatus.

Placed at opposite ends or sides of the silicon crystal 12 are capacitor plates 16 that, as described below, can be used to detect the hyperfine splitting resonance of impurity bound excitons. In particular, the capacitor plates 16 can be used to detect the resonance as a change in photoconductivity. Because of the high efficiency of Auger recombination, the resonance can be detected when relatively few impurity atoms (e.g., ~$10^{12}$ to $10^{14}$ cm$^{-3}$) are present in the silicon crystal 12.

The silicon crystal 12 is further surrounded by a first magnetic coil 18 that can be used to probe or interrogate the hyperfine splitting. As described below, the coil 18 can be energized using a nuclear magnetic resonance (NMR) sequence that comprises RF or microwave pulses 19 that cause the hyperfine splitting levels to resonate. In some embodiments, a pulse sequence is used that does not completely remove the phase accumulation associated with frequency drifts. A second magnetic coil 20 can also surround the silicon crystal 12 that applies a constant electric field to the crystal that creates a small amount of Zeeman splitting.

The clock 10 further includes one or more light sources 22 that can be used to excite the impurity atoms within the silicon crystal 12 and cause them to undergo the energy level transitions that result in the hyperfine splitting. In some embodiments, the light sources 22 are lasers, such as VCSELs or distributed feedback diode lasers. In some embodiments, the laser light has a wavelength in the near infrared (NIR) spectrum. When multiple light sources 22 are provided, one or more can be used to excite the impurity atoms, one or more can be used to interrogate the hyperfine splitting, and one or more can be used to optically ionize/neutralize the impurities.

As is further shown in FIG. 5, the clock 10 also comprises a photoconductive signal reader 24 that sends signals to and receives signals from the capacitor plates 16, an NMR sequencer 26 that generates the NMR sequences for the first magnetic coil 18, and control electronics 28 that receive signals from the photoconductive signal reader, provide control signals to the NMR sequencer, and output clock signals, which can be provided to the associated electronic device.

During operation of the silicon-based atomic clock 10, the single-isotope silicon crystal 12 is maintained at a desired temperature within the housing 14 and a static magnetic field is applied to the crystal by the second magnetic coil 20. Light is emitted by a light source 22 that impinges upon the silicon crystal 12 so as to cause energy level transitions for the impurity atoms contained within the crystal. As a result of these transitions, hyperfine splitting occurs. The hyperfine splitting levels can be caused to resonate by energizing the first magnetic coil 18 with an NMR sequence generated by the NMR sequencer. That resonance can then be detected by the capacitor plates 16 as a change in photoconductivity, and the change can be read by the photoconductive signal reader 24. The photoconductive signal reader 24 can provide the reading to the control electronics 28, which can then generate a clock signal based upon the reading. In addition, the control electronics 28 can provide control signals to the NMR sequencer 26 to alter the NMR sequences provided to the first magnetic coil 18.

As can be appreciated from the discussion of FIG. 5, the resonance of the hyperfine splitting levels can be detected electrically, optically, or through a combination of the two. When electrical detection is used, such as the photocurrent detection scheme described above, the change in photoconductivity resulting from Auger electrons is detected using a noncontact, capacitive photoconductivity approach. This noncontact approach eliminates any possibility of straining the crystal, and also eliminates the need for ohmic contacts. When optical detection is used, resonance can, for example, be detected using a distributed feedback Yb-doped fiber laser that is fed into a Yb-doped fiber amplifier. The detailed spectra may be needed, in which case the laser frequency may need to be locked to an external cavity and scanned by changing the fiber temperature.

Other methods can also be used to detect hyperfine splitting resonance. In one embodiment, electron paramagnetic resonance (EPR) can be used to detect the paramagnetic V$^{++}$ ions in MgO. Derivatives of the EPR method of detecting impurity resonances in silicon that can also further used include electron-nuclear double resonance (ENDOR), low-field electrically detected magnetic resonance (LFEDMR), which provides better sensitivity in the spin carrying isotope $^{29}$Si but is technologically more challenging, and electrically detected magnetic resonance (EDMR).

Coherent population trapping (CPT) can be considered as a destructive quantum interference that occurs when the beat frequency between the two light fields equals the ground state splitting frequency of the atoms. This can be achieved by using two phase-stable optical light fields with a frequency splitting of a few GHz, which is tuned to match the ground state hyperfine splitting of the atoms. This has been demonstrated by actively phase-locking two diode lasers, external modulation of one laser, injection locking of two lasers, or direct modulation of the diode laser injection current. A simple and cheap technique has been demonstrated using a single-mode VCSEL modulated at 9.2 GHz, in order to create side bands for cesium CPT. In the present application, modulating the pump light at the frequency of the clock transition would correspond to the hyperfine splitting of the donor bound excitons. One advantage of CPT is its simplicity.

Claimed are:

1. A silicon-based atomic clock for use in an electronic device, the atomic clock comprising:
   a single-isotope silicon crystal doped with impurity atoms, wherein energy level transitions of the impurity atoms are used as a frequency resonance of the clock;
   a light adapted to excite the impurity atoms within the silicon crystal; and a device configured to detect the energy level transitions of the impurity atoms based at least in part on an electrical measurement of photoconductivity.

2. The atomic clock of claim 1, wherein the single-isotope silicon crystal is a $^{28}$Si crystal.

3. The atomic clock of claim 1, wherein the impurity atoms are single-isotope impurity atoms.

4. The atomic clock of claim 1, wherein the impurity atoms are selected from the group consisting of phosphorus (P), arsenic (As), antimony (Sb), lithium (Li), sodium (Na), sulfur (S), selenium (Se), tellurium (Te), boron (B), gallium (Ga), indium (In), aluminum (Al), beryllium (Be), zinc (Zn), gold (Au), silver (Ag), platinum (Pt), bismuth (Bi), and copper (Cu) atoms, and combinations thereof.

5. The atomic clock of claim 1, wherein the impurity atoms are selected from the group consisting of phosphorus (P), selenium (Se), and bismuth (Bi) atoms, and combinations thereof.

6. The atomic clock of claim 1, wherein the energy level transitions originate from neutral donors or acceptors of the impurity atoms.

7. The atomic clock of claim 1, wherein the energy level transitions originate from impurity bound excitons.

8. The atomic clock of claim 7, wherein the energy level transitions are no-phonon impurity bound exciton transitions.

9. The atomic clock of claim 1, further comprising apparatus configured to interrogate hyperfine splitting that results from the interaction of impurity nuclei and donor electrons.

10. The atomic clock of claim 9, wherein the device is configured to detect resonance of hyperfine splitting levels.

11. The atomic clock of claim 10, wherein the device comprises capacitor plates positioned at opposite ends of the silicon crystal adapted to measure the photoconductivity.

12. The atomic clock of claim 10, further comprising a laser adapted to ionize the impurity atoms with above-bandgap light.

13. The atomic clock of claim 1, wherein the light is a laser light.

14. A method for generating a clock signal, the method comprising
    isotopically purifying silicon to obtain a single-isotope silicon crystal;
    doping the silicon crystal with impurity atoms;
    detecting energy level transitions in the silicon crystal based at least in part on an electrical measurement of photoconductivity of the silicon crystal; and
    generating a clock signal based upon the detected energy level transitions.

15. The method of claim 14, wherein isotopically purifying silicon comprises forming a $^{28}$Si crystal.

16. The method of claim 14, wherein doping the silicon crystal comprises doping the silicon crystal with atoms selected from the group consisting of phosphorus (P), arsenic (As), antimony (Sb), lithium (Li), sodium (Na), sulfur (S), selenium (Se), tellurium (Te), boron (B), gallium (Ga), indium (In), aluminum (Al), beryllium (Be), zinc (Zn), gold (Au), silver (Ag), platinum (Pt), bismuth (Bi), and copper (Cu) atoms, and combinations thereof.

17. The method of claim 14, wherein doping the silicon crystal comprises doping the silicon crystal with atoms selected from the group consisting of phosphorus (P), selenium (Se), and bismuth (Bi) atoms, and combinations thereof.

18. The method of claim 14, wherein detecting energy level transitions comprises detecting resonance of hyperfine splitting levels resulting from energy level transitions originating from neutral donors or acceptors of the impurity atoms.

19. The method of claim 14, wherein detecting energy level transitions comprises exciting the impurity atoms with laser light.

20. The method of claim 19, wherein detecting energy level transitions further comprises interrogating hyperfine splitting with a pulse sequence that does not completely remove phase drifts.

21. The method of claim 20, wherein detecting energy level transitions further comprises detecting resonance of hyperfine splitting levels resulting from the energy level transitions.

22. The method of claim 21, wherein detecting resonance comprises detecting changes in photoconductivity of the silicon crystal.

23. The method of claim 22, further comprising ionizing the impurity atoms with above-bandgap laser light.

* * * * *